(12) United States Patent
Nagase et al.

(10) Patent No.: US 7,532,481 B2
(45) Date of Patent: May 12, 2009

(54) AL/ALN JOINT MATERIAL, BASE PLATE FOR POWER MODULE, POWER MODULE, AND MANUFACTURING METHOD OF AL/ALN JOINT MATERIAL (75) Inventors: Toshiyuki Nagase, Gotenba (JP); Yoshiyuki Nagatomo, Gotenba (JP); Kazuaki Kubo, Mishima (JP); Takeshi Negishi, Saitama (JP)

(73) Assignee: Mitsubishi Materials Corporation, Tokyo (JP)

( * ) Notice: Subject to any disclaimer, the term of this patent is extended or adjusted under 35 U.S.C. 154(b) by 154 days.

(21) Appl. No.: 10/599,622

(22) PCT Filed: Apr. 4, 2005

(86) PCT No.: PCT/JP2005/006618

§ 371 (c)(1),
(2), (4) Date: Oct. 3, 2006

(87) PCT Pub. No.: WO2005/098942

PCT Pub. Date: Oct. 20, 2005

(65) Prior Publication Data
US 2007/0274047 A1    Nov. 29, 2007

(30) Foreign Application Priority Data
Apr. 5, 2004 (JP) .............. 2004-110879
Jul. 29, 2004 (JP) .............. 2004-221700

(51) Int. Cl.
  H05K 7/00   (2006.01)
  H05K 1/14   (2006.01)
  B32B 3/00   (2006.01)
  B32B 15/01  (2006.01)

(52) U.S. Cl. .......... 361/739; 361/706; 361/746; 361/760; 361/771; 428/209; 428/210; 428/650; 428/910

(58) Field of Classification Search ........... 361/704, 361/706, 736, 739, 746, 708, 760, 771; 428/650, 428/209–210, 910
See application file for complete search history.

(56) References Cited

U.S. PATENT DOCUMENTS 4,693,409 A * 9/1987 Mizunoya et al. ....... 228/122.1

(Continued)

FOREIGN PATENT DOCUMENTS

JP        3-234045 A    10/1991

(Continued)

OTHER PUBLICATIONS

International Search Report for PCT/Jp2005/006618 completed Jun. 30, 2005.

(Continued)

Primary Examiner—Jayprakash N Gandhi
Assistant Examiner—Bradley H Thomas
(74) Attorney, Agent, or Firm—Darby & Darby, P.C.

(57) ABSTRACT

A base plate for a power module includes: a metal plate, a ceramic base plate joined to the metal plate, and a release agent which includes boron provided in a joint surface between the metal plate and the ceramic base plate. A remaining amount of the release agent is less than 5, as an amount of boron measured by fluorescence X-ray analysis, where the amount of boron is defined as a value obtained by an expression: (a peak height of B-K$\alpha$/a peak height of X-K$\alpha$) x 100000 and a crystal grain straining region in the joint surface is equal to or less than 40%, or an amount of crystal grain straining in the joint surface is equal to or less than 0.03%.

6 Claims, 6 Drawing Sheets

U.S. PATENT DOCUMENTS

| | | | | |
|---|---|---|---|---|
| 5,354,415 | A * | 10/1994 | Fushii et al. | 216/13 |
| 5,807,626 | A * | 9/1998 | Naba | 428/210 |
| 6,013,357 | A * | 1/2000 | Sakuraba et al. | 428/210 |
| 6,033,787 | A * | 3/2000 | Nagase et al. | 428/545 |
| 6,122,170 | A * | 9/2000 | Hirose et al. | 361/704 |
| 6,221,511 | B1 * | 4/2001 | Sakuraba et al. | 428/621 |
| 6,309,737 | B1 * | 10/2001 | Hirashima et al. | 428/210 |
| 6,310,775 | B1 * | 10/2001 | Nagatomo et al. | 361/707 |
| 6,328,198 | B1 * | 12/2001 | Ohashi et al. | 228/194 |
| 6,485,816 | B2 * | 11/2002 | Araki et al. | 428/210 |
| 6,569,514 | B2 | 5/2003 | Naba et al. | |
| 6,689,498 | B2 * | 2/2004 | Shinosawa et al. | 428/698 |
| 6,692,818 | B2 * | 2/2004 | Hirano et al. | 428/209 |
| 7,128,979 | B2 * | 10/2006 | Nagase et al. | 428/545 |
| 7,236,367 | B2 * | 6/2007 | Lucke et al. | 361/717 |
| 7,255,931 | B2 * | 8/2007 | Osanai et al. | 428/650 |
| 7,270,885 | B1 * | 9/2007 | Karandikar et al. | 428/446 |
| 7,348,493 | B2 * | 3/2008 | Osanai et al. | 174/256 |
| 2002/0037435 | A1 * | 3/2002 | Hirashima et al. | 428/693 |
| 2002/0060091 | A1 | 5/2002 | Naba et al. | |
| 2002/0164488 | A1 * | 11/2002 | Furo et al. | 428/469 |
| 2003/0098632 | A1 * | 5/2003 | Takeuchi et al. | 310/328 |
| 2004/0070946 | A1 * | 4/2004 | Matsuo et al. | 361/709 |
| 2004/0074951 | A1 * | 4/2004 | Takahashi et al. | 228/219 |
| 2004/0089928 | A1 * | 5/2004 | Nakajima et al. | 257/678 |
| 2004/0207072 | A1 * | 10/2004 | Hiramatsu et al. | 257/705 |
| 2005/0214518 | A1 * | 9/2005 | Nagase et al. | 428/210 |

FOREIGN PATENT DOCUMENTS

| | | |
|---|---|---|
| JP | 6-9275 A | 1/1994 |
| JP | 8-109069 A | 4/1996 |
| JP | 10-67586 A | 3/1998 |
| JP | 2002-171037 A | 6/2002 |
| JP | 2003-17627 A | 1/2003 |

OTHER PUBLICATIONS

Patent Abstracts of Japan for JP2002-171037 published Jun. 14, 2002.
Patent Abstracts of Japan for JP3-234045 published Oct. 18, 1991.

* cited by examiner

AL/ALN JOINT MATERIAL, BASE PLATE FOR POWER MODULE, POWER MODULE, AND MANUFACTURING METHOD OF AL/ALN JOINT MATERIAL

TECHNICAL FIELD

The present invention relates to an Al/AlN joint material, a base plate for a power module, and a power module which are used in a semiconductor device for controlling high current and high voltage of, for example, an electric automobile or an electric rolling stock, and a manufacturing method of the Al/AlN joint material.

CROSS-REFERENCE TO PRIOR APPLICATION

This is a U.S. National Phase Application under 35 U.S.C. §371 of International Patent Application No. PCT/JP2005/006618 filed Apr. 4, 2005, and claims the benefit of Japanese Patent Applications No. 2004-110879, filed Apr. 5, 2004 and 2004-221700, filed Jul. 29, 2004, all of which are incorporated by reference herein. The International Application was published in Japanese on Oct. 20, 2005 as WO 2005/098942 A1 under PCT Article 21(2).

BACKGROUND ART

Traditionally among semiconductor elements, a power module for a power supply has a relatively large heating value, and it is necessary to select a base plate which allows preferable heat release performance of the entire circuit base plate preferable as a base plate on which the power module is mounted. Therefore, a base plate which uses an aluminum nitride (AlN) base plate having a high thermal conductivity as a ceramic base plate, and aluminum (Al) also having a high thermal conductivity as a metal circuit plate, is in practical use (refer to, for example, Patent Documents 1 and 2).

Patent Document 1: Japanese Unexamined Patent Application, First Publication No. H03-234045

Patent Document 2: Japanese Unexamined Patent Application, First Publication No. 2002-171037

Figure 9:
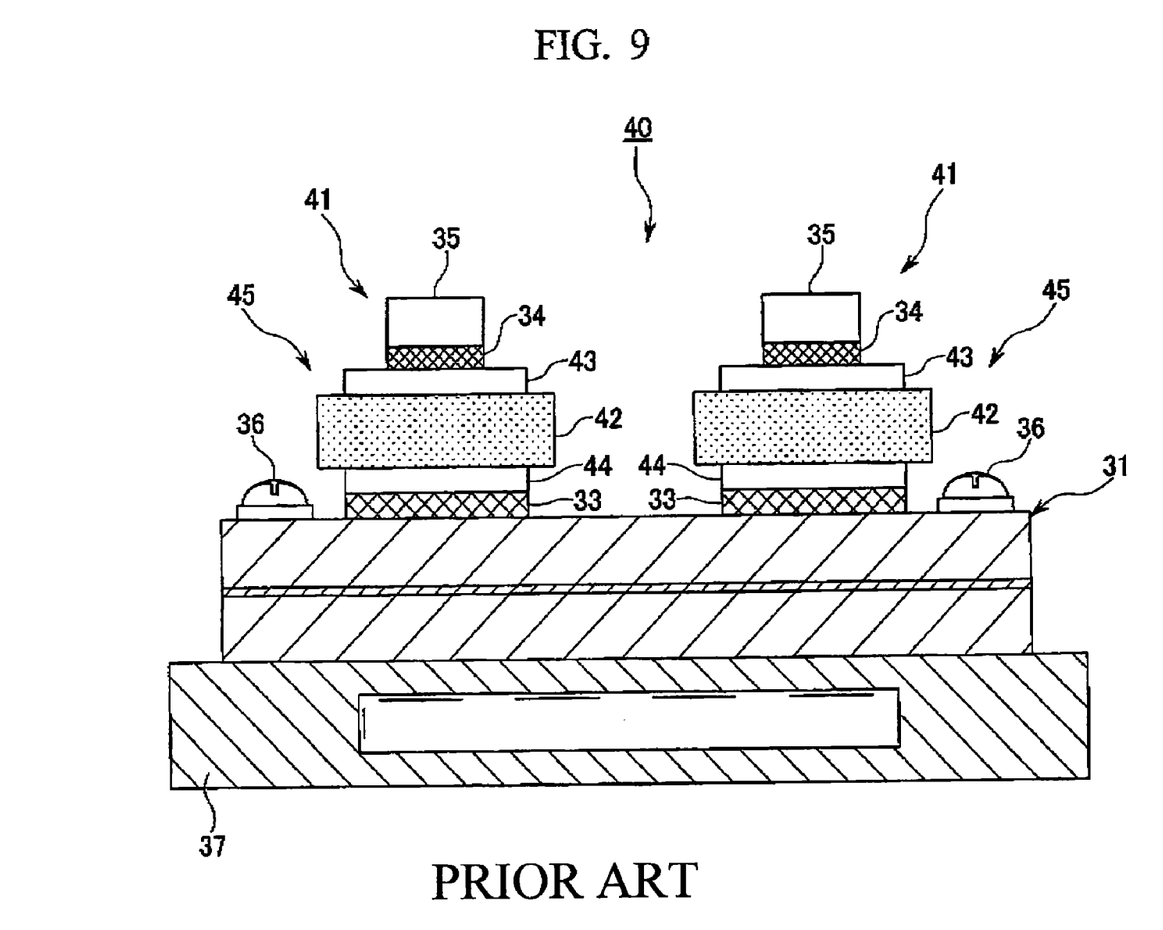
FIG. 9 is a schematic diagram showing a power module base plate and a power module which in which a conventional AlN/Al joint material is used.

A power module 40 shown in FIG. 9 is known as an example. In this power module 40, two power module base plates 41 are joined on a heat-releasing object 31 by a brazing material 33 or solder. The heat-releasing object 31 is fixed on a water-cooled heat sink 37 by male threads 36.

Each power module base plate 41 is constituted so as to include an AlN/Al joint material 45 and a semiconductor chip 35. The AlN/Al joint material 45 is constituted by a circuit layer 43 made of aluminum being laminated on the first side of an insulated base plate 42 made of AlN (hereinbelow, referred to as an AlN base plate 42), and a metal layer 44 made of aluminum being laminated on the second side of the AlN base plate 42. The semiconductor chip 35 is mounted on the circuit layer 43 via solder 34. As the metal layer 44 or the circuit layer 43, 4N-Al (aluminum with purity greater than 99.99%) may be used to constitute the AlN/Al joint material.

DISCLOSURE OF INVENTION

However, the following issues remain in the art of the conventional power module base plate. That is, as the first issue, when joining the metal plate of the ceramic base plate, there is a disadvantage in that sufficient joint strength cannot be obtained even though the surface roughness of the ceramic base plate is decreased simply, and reliability cannot be improved. For example, even if a dry honing is performed on the surface of the ceramic base plate with $Al_2O_3$ particles and its surface roughness is made to be Ra=0.2 μm, it has been realized that there is a case in which interfacial peeling occurs in a delamination test. When the surface roughness is made to be Ra less than 0.1 μm, peeling similarly occurs.

In addition, as the second issue, when using AlN base plate as the insulated base plate, the strength of the AlN base plate itself is low. However, sufficient heat releasing performance can be obtained because of its high thermal conductivity. Therefore, if a temperature cycle is repeated in using the power module, there may be a case in which a crack is formed thereon and the metal circuit plate peels. As a result, there has been a problem of a low heat-resistance cycle in which the heat releasing performance of the power module decreases and the operational reliability of the electric device also decreases. This is particularly significant in a heat cycle test (from −40 to 125° C.).

On the other hand, in a green sintering of AlN in the manufacturing process of the AlN base plate, boron nitride (BN) adheres on the surface layer of the AlN base plate after sintering because the sintering is performed after laminating BN sheets as templates on both sides of the green sheet made of AlN. Therefore, it is difficult to directly join the Al metal layer on the AlN base plate, and BN is removed from the surface layer of the AlN base plate by honing or the like before joining the Al circuit layer or the Al metal layer.

However, even though sufficient initial joint strength can be obtained by removing BN, it is difficult to secure a sufficient heat-resistance cycle when repeating a temperature cycle, and the life of the power module greatly varies. For this reason, the performance of the power module has not been sufficient for purposes which are expected to increase such as electric automobiles or in-house power generation for personal use, in which the temperature cycle is frequently repeated.

The present invention was made in view of the aforementioned issues, and its first object is to provide a power module and a base plate therefore in which a high joint strength of a metal plate and a ceramic base plate can be obtained.

Its second object is to provide a manufacturing method of an Al/AlN joint material which has a sufficient heat-resistance cycle and a sufficient lifespan, without peeling between the insulated base plate and the heat-releasing object, warpage, or cracking in the insulated base plate and the heat releasing object, not only in the initial joint strength but also when repeating thermal expansion and contraction due to a temperature cycle when joining the Al to the AlN base plate, a highly-reliable Al/AlN joint material made by the manufacturing method, and a power module and a base plate therefore which use the Al/AlN joint material.

A base plate for a power module of the present invention is a base plate for a power module including: a metal plate; a ceramic base plate joined to the metal plate; and a release agent provided in a joint surface between the metal plate and the ceramic base plate, wherein a remaining amount of the release agent is less than 5 as an amount of boron measured by a fluorescence X-ray analysis, and wherein a crystal grain straining region in the joint surface is equal to or less than 40%.

The amount of Boron measured by fluorescence X-ray analysis is defined as a value obtained by an expression: a peak height of B—Kα/a peak height of Al—Kα×100000. The peak heights of B—Kα and Al—Kα are obtained by fluorescence X-ray analysis.

The crystal grain straining region is a dark space in a crystal grain in the interface observed in a bright-field image of the ceramic crystal grain by a transmission electron microscope (TEM). That is, a region in which dislocation exists.

Since the release agent is less than 5 as an amount of boron measured by fluorescence X-ray analysis and the crystal grain straining region in the joint surface is equal to or less than 40% in the ceramic base plate of this base plate for a power module, a high joint strength can be obtained both in its initial state and after the temperature cycle test. The reason the release agent is set to less than 5 as an amount of boron measured by fluorescence X-ray analysis is to prevent a decrease in joining by too much of the release agent (for example, boron nitride (BN)) remaining after sintering the ceramic base plate.

A base plate for a power module of the present invention is a base plate for a power module including: a metal plate; a ceramic base plate joined to the metal plate, and a release agent provided in a joint surface between the metal plate and the ceramic base plate, wherein a remaining amount of the release agent is less than 5 as an amount of boron measured by fluorescence X-ray analysis, and wherein a crystal grain straining amount in the joint surface is equal to or less than 0.03%.

Since the release agent is less than 5 as an amount of boron measured by fluorescence X-ray analysis and the crystal grain straining amount (a straining amount obtained from a crystallite size and a lattice inhomogeneous strain measured by X-ray diffraction) in the joint surface is equal to or less than 0.03% in the ceramic base plate of this base plate for a power module, a high joint strength can be obtained both in its initial state and after the temperature cycle test as will be described after.

The metal plate may be an aluminum plate, and the ceramic base plate may be a plate made of aluminum nitride or silicone nitride.

A power module of the present invention is a power module to which a semiconductor chip is mounted on the metal plate of the base plate for a power module.

An Al/AlN joint material of the present invention is an Al/AlN joint material including; aluminum; aluminum nitride joined on the aluminum; and a brazing material provided between the aluminum and the aluminum nitride, wherein the brazing material infiltrates in a porous layer on a surface of the aluminum nitride, and wherein at least a portion of the brazing material forms a three-dimensional network structure within substantially equal to or more than 0.5 layers and equal to or less than three layers of a crystal structure of the aluminum nitride.

In this Al/AlN joint material, since the inside of the porous layer of the surface of the AlN, that is, at least a portion of the brazing material infiltrated in a gas pocket portion between crystal grains of AlN forms a three-dimensional network structure, the porous body on the surface of the AlN and the brazing material having the three-dimensional network structure tightly join, and the Al, the brazing material, and the AlN are securely joined. In addition, since the three-dimensional network structure is within substantially equal to or more than 0.5 layers of the crystal structure of AlN, the brazing material goes behind the AlN crystal and tightly joins. Furthermore, by using less than three layers of a crystal structure of the AlN in which a weak layer does not exist, the amount of brazing material used in joining can be reduced and peeling caused by the temperature cycle can be prevented. Therefore, a high joint strength can be secured not only in the initial joint but also after a heat cycle.

The diameter of the three-dimensional network structure may be greater inside the aluminum nitride than on a surface of the aluminum nitride. That is, the three-dimensional network structure may be made thinner on the surface of the AlN.

In this case, since the diameter of the three-dimensional network structure of the infiltrated brazing material is greater inside of the AlN than in the surface thereof, the brazing material can be securely joined to the AlN by an anchor effect. As a result, the peeling caused by the temperature cycle can be prevented more securely.

Another aspect of the base plate for a power module of the present invention is a base plate for a power module including; an insulated base plate; and a heat-releasing object provided on a first side of the insulated base plate, wherein the insulated base plate is the Al/AlN joint material according to the present invention.

Another aspect of the power module of the present invention is a power module including the base plate for a power module according to the present invention and a chip which is mounted on a second side of the insulated base plate.

A heat sink of any one of air-cooled and water-cooled may be mounted on a second side of the insulated base plate.

In this power module base plate or power modules, since the Al/AlN joint material in which Al and AlN are securely joined via the brazing material is used, they are hard to peel by the temperature cycle and highly reliable in heat resistance. Their cooling efficiency further improves when a heat sink is provided.

A manufacturing method of an Al/AlN joint material of the present invention is one including: a first step of obtaining an AlN sintering body having a porous layer on a surface thereof by sintering a powder of AlN; and a second step of joining an Al member of the porous layer via a brazing material.

In this manufacturing method of an Al/AlN joint material, since the porous layer is formed on the AlN sintering body which is joined to the Al member via the brazing material, the brazing material enters gas pockets in the porous layer of the AlN sintering body and solidifies in the gas pockets. Therefore, the brazing material is tightly fixed in the AlN sintering body, and the Al member and the AlN sintering body are securely joined.

The Al member may be joined via the brazing material after removing a weak porous layer formed near the outermost surface of the AlN sintering body. In this case, the brazing material enters gas pockets in the porous layer of the AlN sintering body and solidifies in the gas pockets.

In this manufacturing method of an Al/AlN joint material, since the weak porous layer formed near the outermost surface of the AlN sintering body is processed to be removed, the surface is difficult to peel even if a force is applied on a joint surface. Therefore, the peeling in the joint surface of the Al/AlN joint material is further securely prevented.

Another aspect of the manufacturing method of an Al/AlN joint material of the present invention is characterized in heating and pressurizing the AlN sintering body and the Al member under vacuum, with the brazing material being provided between the AlN sintering body and the Al member.

In this manufacturing method of an Al/AlN joint material, the air in the gas pockets in the porous layer formed on the surface of the AlN sintering body is removed by heating under vacuum and the brazing material easily enters the gas pockets. In addition, the joint surface of the brazing material and the AlN sintering body is difficult to become oxidized. Furthermore, the brazing material can be pushed in the gas pockets in the porous layer of the AlN sintering body against the surface tension of the brazing material by pressurizing.

In the manufacturing method, the joint surface may be set in a vacuum, a liquid phase may occur in the brazing material by heating, and the liquid of the brazing material may be infiltrated in a porous layer of the AlN sintering body.

In this manufacturing method of an Al/AlN joint material, since the liquid phase occurs in the brazing material after the joint surface of the AlN sintering body is set in a vacuum, the infiltration of the melted brazing material begins after the air in the gas pockets in the porous layer formed on the surface of the AlN sintering body is completely removed. Therefore, the brazing material infiltrates in every corner of the gas pockets in the porous layer. Furthermore, the brazing material is pushed to small gaps in the gas pockets against the surface tension of the brazing material.

The Al member may be joined to the AlN sintering body via the porous layer of the AlN sintering body by cooling and setting the liquid of the brazing material provided between the AlN sintering body and the Al member.

In this case, the brazing material is fixed inside the porous layer of the AlN sintering body by cooling and setting the liquid of the brazing material after the melted brazing material enters the gas pockets of the porous layer formed on the surface of the AlN sintering body.

According to the present invention, the metal plate and the ceramic base plate which constitutes the base plate for a power module are joined with high strength and have a good reliability in environment tests such as a temperature cycle test. Therefore, high joint strength can be obtained in the initial state and after the temperature cycle test and a power module of high reliability even under circumstances in which the temperature significantly changes can be obtained.

In addition, according to an Al/AlN joint material of the present invention, a sufficient heat-resistance cycle and a sufficient life can be obtained without peeling between the insulated base plate and the heat-releasing object and warpage or cracking in the insulated base plate and the heat releasing object, not only in the initial joint strength but also when repeating thermal expansion and contraction due to a temperature cycle. Therefore, the Al/AlN joint material, a ceramic circuit base plate using the Al/AlN joint material, and a power module using the Al/AlN joint material can be obtained.

| | |
|---|---|
| 1 | ceramic base plate |
| 2 | metal circuit plate (metal plate) |
| 3 | metal plate |
| 5 | Si chip (semiconductor chip) |
| 10 | AlN/Al joint material (insulated base plate) |
| 11 | AlN base plate (AlN sintering body) |
| 12, 13 | Al plate (Al member) |
| 14 | brazing material |
| 23 | weak porous layer |
| 31 | heat-releasing object |
| 30 | power module |
| 32 | power module base plate |
| 35 | semiconductor chip (chip) |
| 37 | water-cooled heat sink |

BEST MODE FOR CARRYING OUT THE INVENTION

A power module and a base plate therefore of a first embodiment of the present invention shall be described below, with reference to FIGS. 1 and 2.

Figure 1:
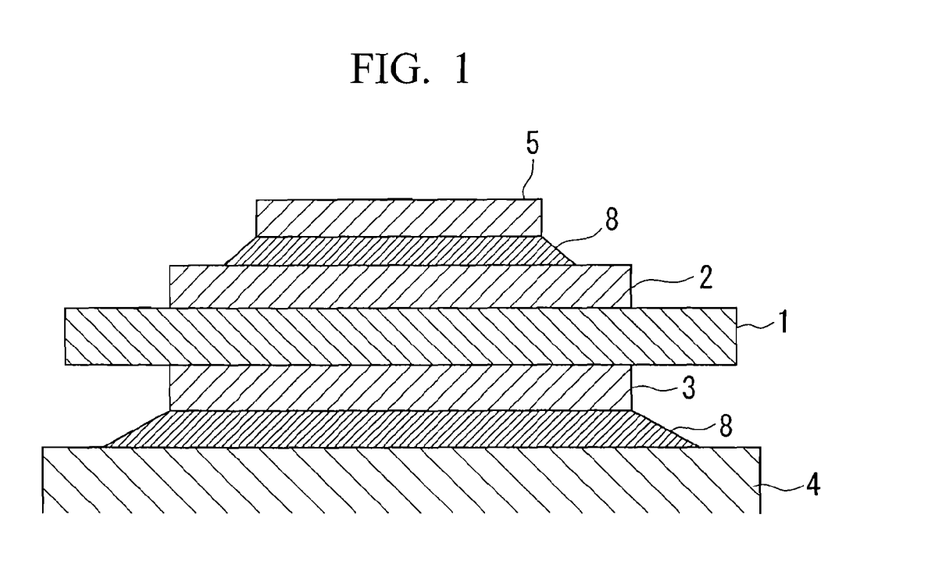
FIG. 1 is a cross sectional view of a power module of a first embodiment of the present invention.
Figure 2:
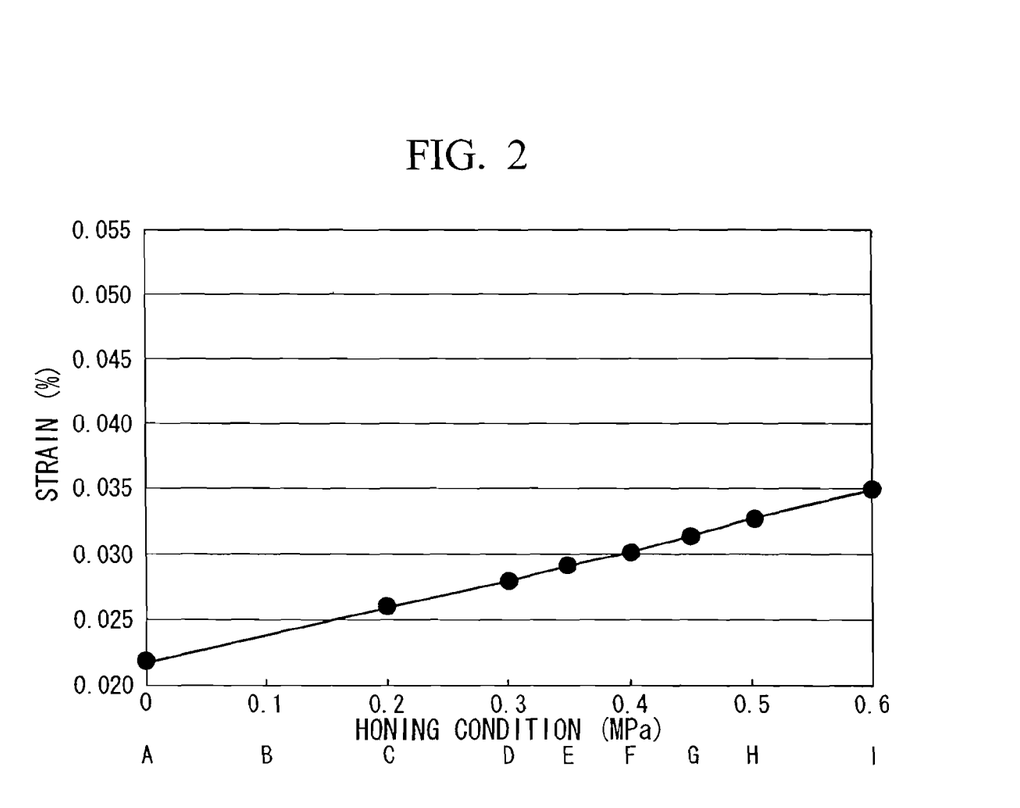
FIG. 2 is a graph showing strains in honing conditions in the first embodiment of the present invention.

A power module and a base plate therefore of the present embodiment include a Si chip 5 (a semiconductor chip) mounted thereon as shown in FIG. 1. The structures of the power module and the base plate therefore shall be described with their manufacturing processes. First, a ceramic base plate 1 made of AlN (e.g., 50 mm×30 mm, 0.635 mm in thickness), a metal circuit plate 2 made of aluminum (for example, with purity higher than 99.9%), a metal plate 3 made of aluminum (for example, with purity higher than 99.9%), and brazing material (for example, Al—Si foil, 50 mm×30 mm, less than 0.1 mm in thickness) are prepared.

Next, honing is performed a predetermined number of times at a predetermined pressure on the surface of the ceramic base plate 1 so that a remaining amount of the release agent (BN) in a joint surface between the ceramic base plate 1 and the metal circuit plate 2 is less than 5 as B amount (an amount of boron) measured by fluorescence X-ray analysis, and that a crystal grain straining region in the joint surface is equal to or less than 40%. The crystal grain straining region is a region in which a crystal having more than 40% of a dark space in a crystal grain, that is, a dislocation portion exists in the interface in an observation (in a bright-field image) by a transmission electron microscopy (TEM).

The honing may be performed so that the remaining amount of the release agent in the joint surface between the ceramic base plate 1 and the metal circuit plate 2 is less than 5 as the B amount measured by fluorescence X-ray analysis, and that a crystal grain straining amount in the joint surface measured by crystallite size by X-ray diffraction and a lattice inhomogeneous strain measurement is equal to or less than 0.03%.

Next, the metal circuit plate 2 is joined on the upper face of the ceramic base plate 1 via the brazing material, and the metal plate 3 made of Al is joined on the lower face of the ceramic base plate 1 via the same brazing material in the same manner.

In this joint process, the brazing material is sandwiched and laminated between the ceramic base plate 1 and the metal circuit plate 2 and between the ceramic base plate 1 and the metal plate 3. They are joined by applying a load and being heated at more than 600° C. under vacuum or in a reduction atmosphere.

After printing a resist on the metal circuit plate 2 of an Al/AlN/Al joint material obtained by the aforementioned process, a predetermined circuit pattern is formed by etching, and the power module base plate is manufactured.

Next, the Si chip 5 is joined on the metal circuit plate 2 of the power module base plate by a solder 8, and the power module base plate is joined to a heat releasing plate 4 via the metal plate 3 by the solder 8. The power module of the present embodiment is thus manufactured.

In the power module and the base plate therefore, since the remaining amount of the release agent in the joint surface between the ceramic base plate 1 and the metal circuit plate 2 is less than 5 as the B amount measured by fluorescence X-ray analysis, and the crystal grain straining region in the joint surface is equal to or less than 40% or the crystal grain straining amount in the joint surface is equal to or less than 0.03%, high joint strength can be obtained even after a temperature cycle test, which will be shown as the test result of the embodiment later.

Figure 3:
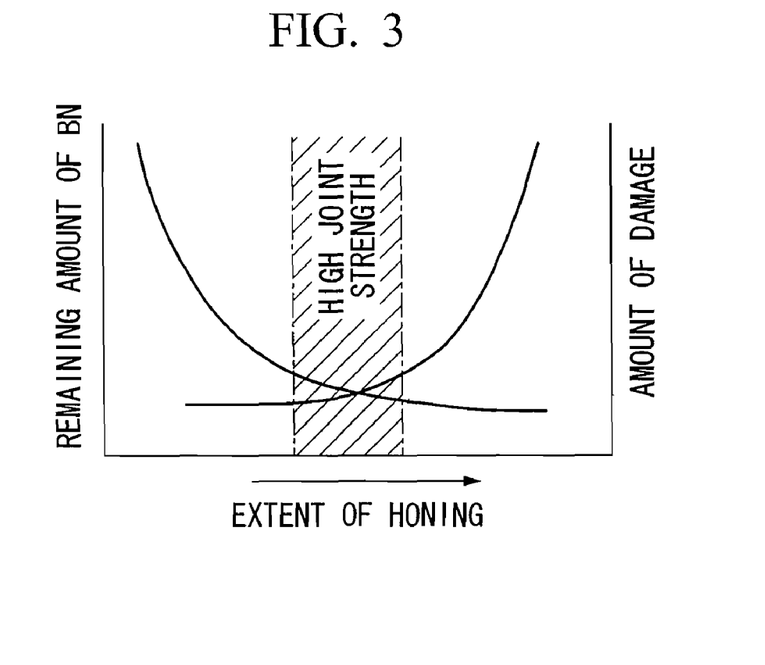
FIG. 3 is a graph explaining a relationship between the remaining amount of BN and the amount of surface damage to honing degrees in the first embodiment of the present invention.

That is, since the remaining amount of the release agent in the joint surface between the ceramic base plate 1 and the metal circuit plate 2 is less than 5 as the B amount measured by fluorescence X-ray analysis, a decrease in joint performance due to a large amount of the release agent of BN included in sintering the ceramic base plate 1 remaining on the interface can be prevented. The remaining amount of the release agent and the amount of damage on the surface (the joint surface) of the ceramic base plate 1 are in a trade-off relationship in accordance with the extent of the honing as shown in FIG. 3, and high joint strength can be obtained in a state in which both the remaining amount and the amount of damage are low.

Next, an AlN/Al joint material and a manufacturing method thereof shall be described with reference to FIGS. 4 to 7.

Figure 4:
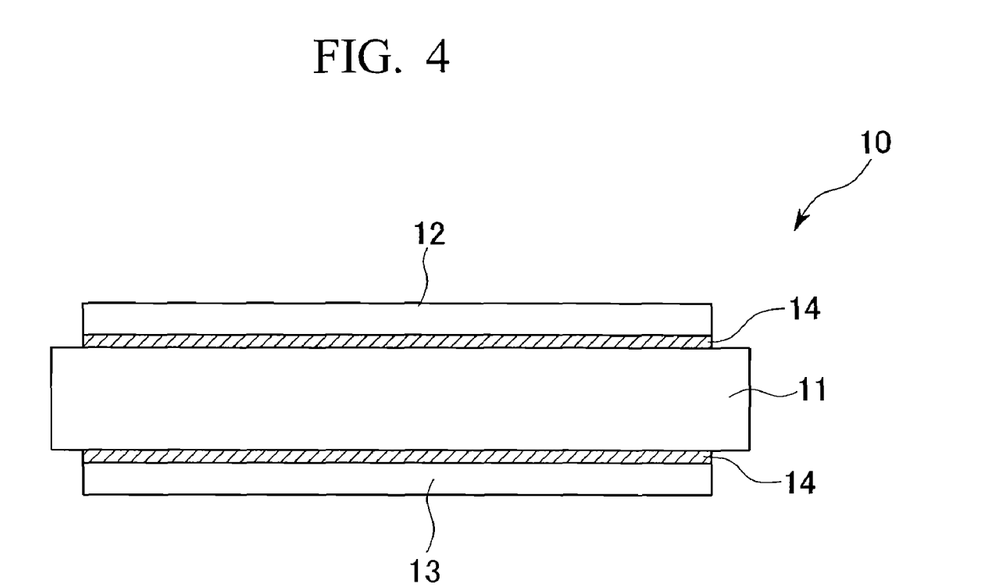
FIG. 4 is a schematic diagram showing an AlN/Al joint material of a second embodiment of the present invention.

FIG. 4 is a cross-sectional view of an AlN/Al joint material (an insulated base plate) 10 of a second embodiment of the present invention. The AlN/Al joint material 10 is constituted by Al plates (conductive layers) 12 and 13 being joined on both respective faces of an AlN base plate (an insulated ceramic base plate) 11 via a brazing material 14.

The AlN base plate of the AlN/Al joint material 10 is formed at a desired size, for example, from 0.3 mm to 1.5 mm. Though the shape of the AlN/Al joint material 10 is generally a rectangle, it may be another shape. These constitutions can be applicable to the aforementioned first embodiment.

The Al plates 12 and 13 contain more than 99.99% Al by mass. By containing more than 99.99% Al by mass, the strain release effect of the Al plates 12 and 13 is improved, and bending of the AlN/Al joint material 10 and cracking of the AlN base plate 11 when exposed to a temperature change are prevented. Though the thicknesses of the Al plates 12 and 13 are not limited, they are, for example, from 0.25 mm to 0.6 mm. More specifically in the present embodiment, the thickness of the AlN base plate 11 is, for example, 0.635 mm, and the thickness of the Al plates 12 and 13 is, for example, 0.4 mm. The Al plates 12 and 13 may be joined to the entire surface of the AlN base plate 11, or they may also be formed on the surface of the AlN base plate 11, except its periphery. These constitutions can be applicable to the aforementioned first embodiment.

Though the thickness of the brazing material 14 is not limited, it is, for example, from 0.005 mm to 0.05 mm. More specifically, it is around 0.03 mm. Though the material of the brazing material 14 is not limited, it is preferable that one or more than two materials be selected from an aluminum base alloy brazing material such as Al—Si series, Al—Ge series, Al—Mn series, Al—Cu series, Al—Mg series, Al—Si—Mg series, Al—Cu—Mn series, and Al—Cu—Mg—Mn series. All the brazing materials contain Al from 70 to 98% by mass. Among them, an Al—Si series brazing material is especially preferable. The Al—Si series brazing material is, for example, an alloy containing Al at 95 to 75% by mass and Si at 3 to 20% by mass, and its melting point (eutectic point) is 577° C. These constitutions can be applicable to the aforementioned first embodiment.

Figure 5:
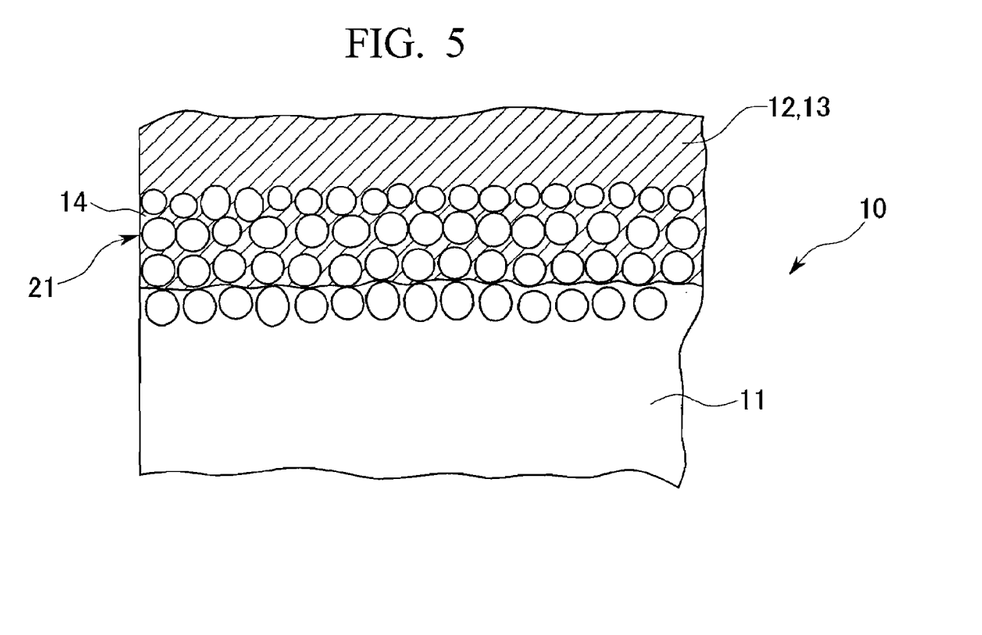
FIG. 5 is a schematic diagram showing the joint surface of the AlN insulated body and the Al of the second embodiment of the present invention.

As shown in FIG. 5, the Al/AlN joint material 10 has a porous layer 21 on its surface. At least a portion of the space (gas pockets) forming the porous layer is formed as a three-dimensional network structure and the spaces constituting the three-dimensional network structure are greater inside of the AlN member than on the surface thereof. The region having the three-dimensional network structure is formed within substantially equal to or more than 0.5 layers and equal to or less than three layers of the crystal of the aluminum nitride, and the brazing material 14 infiltrates and sets in the gas pockets (spaces) constituting the three-dimensional network structure. In this specification, one layer is defined as a thickness corresponding to the diameter of the AlN crystal grain, which is equal to or greater than 1 μm and equal to or smaller than 15 μm.

It is preferable that each thickness of the Al plates 12 and 13 joined to both faces of the insulated AlN base plate 11 be made equal. It is also preferable that the Al plates 12 and 13 be joined to both faces of the insulated AlN base plate 11. Because the insulated AlN base plate 11 becomes prone to bending when the thicknesses of the Al plates 12 and 13 are different or when the Al plate is joined only to one face of the insulated AlN base plate 11. However, it may be provided only on one face if required.

According to the Al/AlN joint material 10 of the present embodiment, since a portion of the gas pockets forming the porous layer 21 are formed as a three-dimensional network structure, the crystal grain of the AlN base plate 11 and the brazing material 14 filled in the gas pockets in the three-dimensional network structure engage with each other, and the Al plates 12 and 13, and the AlN base plate 11 are reliably joined.

Since the brazing material 14 diffuses and joins in the three-dimensional network structure, stress is dispersed into each anchor portion of the crystal particles on the surface of the AlN, when the Al/AlN joint material, and the Al plates and AlN base plate which constitute the Al/AlN joint material repeat expansion and reduction. Therefore, a stable joint is secured not only in the initial joint of the joint material, but also after a heat cycle.

Since, in the Al/AlN joint material 10, the three-dimensional network structure exists in an area corresponding to substantially equal to or more than 0.5 layers of the crystal structure of the AlN, the brazing material reaches behind the AlN crystals and strongly holds them. In addition, by using the gas pockets within an area corresponding to substantially three layers of the crystal grain as the three-dimensional network structure and not by using a weak layer in a deep layer of the AlN base plate, the amount of the brazing material can be reduced, and peeling due to the temperature cycle can be prevented.

Since the spaces in the three-dimensional network structure are greater inside of the Al/AlN joint material 10 than on the surface thereof, the brazing material is reliably joined to the AlN due to an anchor effect. As a result, peeling due to the temperature cycle can be prevented.

The manufacturing method of the AlN/Al joint material 10 shall be described.

Figure 6:
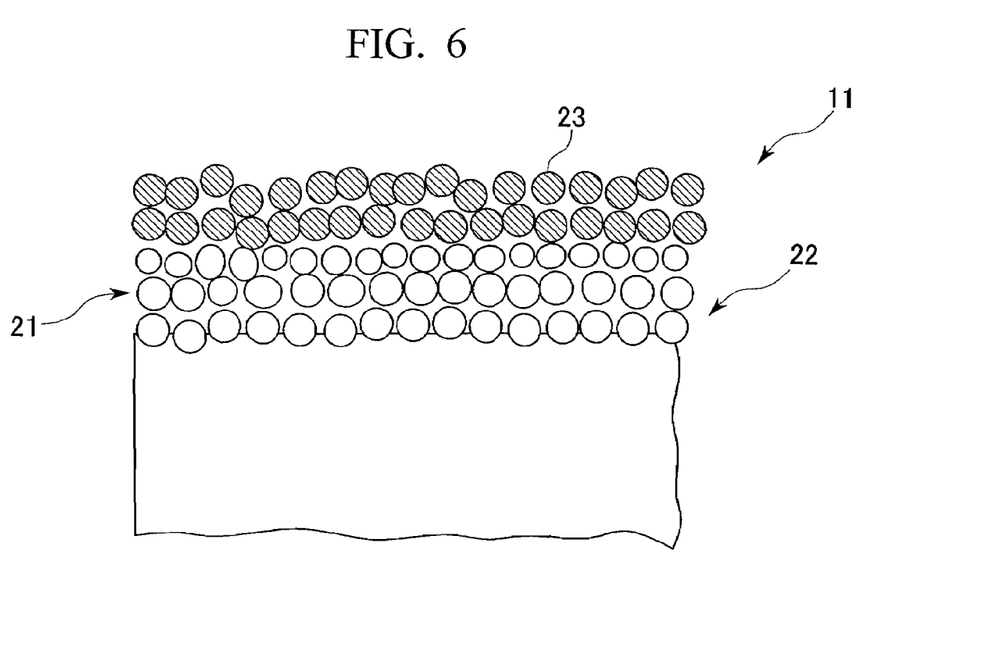
FIG. 6 is a schematic diagram showing the AlN insulated body after green sintering of the second embodiment of the present invention.

First, templates made of Boron nitride (BN) sheet are laminated on the upper and lower faces of a green sheet of AlN. The material 22 of the AlN base plate shown in FIG. 6 is obtained by performing green sintering of AlN. In FIG. 6, the AlN base plate 11 includes the porous layer 21 and a weak porous layer 23 formed on the surface of the porous layer 21. At least a portion of the surface of the porous layer 21 constitutes the three-dimensional network structure (not illustrated).

Next, the BN (not illustrated) adhering on the surface of the AlN base plate 11 and the weak porous layer 23 formed on the outermost surface of the AlN base plate 11 are removed by honing on the surface of the material 22 of the AlN base plate after sintering. The weak porous layer 23 may be grinded before the honing if necessary.

In this case, the honing is performed by using $Al_2O_3$ particles of #600, under a condition in which a pressure is equal to or greater than 500 hPa (0.49 $Kg/cm^2$) and equal to or less than 2500 hPa (2.47 $kg/cm^2$), so that the maximum height Ry (JIS B0601-1994) becomes within 1.50 to 3.30 µm.

Figure 7:
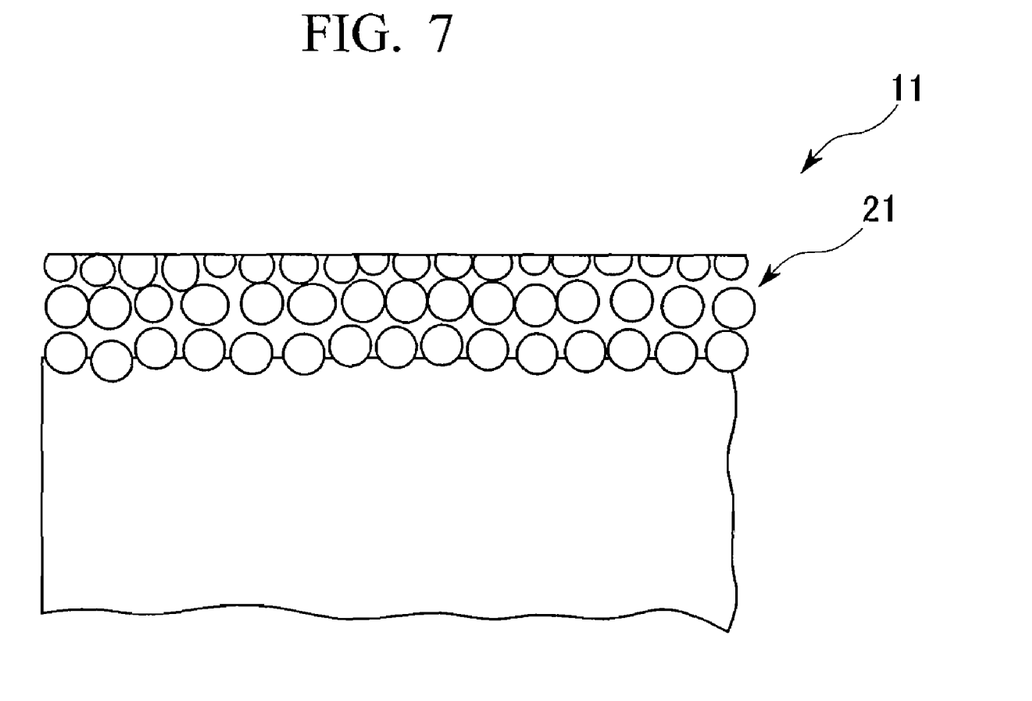
FIG. 7 is a schematic diagram showing the AlN insulated body of the second embodiment of the present invention.

The surface asperity of the crystal structure of the porous layer 21 on the surface of the AlN base plate 21 is prevented from becoming flat as shown in FIG. 7 by setting the honing pressure equal to or less than 2500 hPa. The BN on the porous layer of the surface of the AlN after green sintering is sufficiently removed by setting the honing pressure equal to or greater than 500 hPa. Openings for the infiltration of the brazing material are sufficiently formed on the surface of the AlN base plate 11 and between AlN particles, the brazing material infiltrates more easily, and the surface asperity of the crystal structure of the porous layer 21 is maintained.

Next, the sheet of the brazing material 14, the AlN base plate 11, the sheet of the brazing material 14, and the Al plate 12 are stacked on the Al plate 13 in order. The stacked materials are heated at equal to or greater than 600° C. and equal to or less than the melting point of the Al plates 12 and 13 under vacuum. The brazing material 14 is melted and forms a liquid phase.

The air filled in the gas pockets in the porous layer 21 and the three-dimensional network structure on the surface of the AlN base plate 11 is discharged by vacuumizing the materials, and a vacuum forms in the inside of the gas pockets.

The brazing material 14 in the liquid phase infiltrates in spaces (the vacuumized gas pockets) in the three-dimensional network structure by pressurizing the joint surface between the Al plates 12 and 13, and the AlN base plate 11 to 50 to 300 kPa (approximately 0.5 to 3 $kg/cm^2$). The brazing material 14 is set by cooling the liquid to 500° C. at a cooling rate of 0.5 to 1.0° C./min. The AlN base plate 11 and the Al plates 12 and 13 are thus joined via the AlN porous layer 21.

The pressure in joining is appropriately equal to or greater than 50 kPa for preventing unevenness in the joining, and equal to or less than 300 kPa for preventing cracking of the AlN base plate 11 in joining.

It is preferable to heat the brazing material at equal to or greater than 600° C., in which the liquid phase reliably occurs in the brazing material, for securing a sufficient joint strength, and it is preferable to heat the brazing material equal to or less than the melting point of the Al plates 12 and 13 for securing the aforementioned crystal grain diameter.

After brazing, the materials are cooled to room temperature, then the power module base plate is obtained by forming a circuit by etching one of the Al plates 12 and 13 as a predetermined pattern.

According to the manufacturing method of the AlN/Al joint material 10 of the embodiment, since the porous layer 21 is previously formed on the surface of the AlN base plate, the surface to which the Al plates 12 and 13 are joined, the brazing material 14 forms the liquid phase, and infiltrates and sets in the gas pockets in the porous layer 21 of the AlN base plate 11 when joining the Al plates 12 and 13. Therefore, the brazing material 14 is reliably fixed inside the AlN base plate 11 and the materials are reliably joined.

In addition, since the weak porous layer on the outermost surface of the AlN is processed to remove it, the brazing material is strongly fixed on the AlN joint surface. Therefore, the surface of the AlN is difficult to peel when a force is applied on the joint surface, and the peeling of the joint surface of the Al/AlN joint material is prevented.

Since the AlN base plate 11 and the Al plates 12 and 13 are pressurized and heated under vacuum in a state in which the brazing material 14 is disposed on the faces of the AlN base plate 11 which are joined to the Al plates 12 and 13, the air in the gas pockets of the porous layer 21 formed on the surface of the AlN base plate 11 is removed, and the brazing material easily infiltrates in the gas pockets. In addition, the brazing material 14 and the joint surface of the AlN base plate are not oxidized. Furthermore, the melted brazing material 14 is pushed into the gas pockets against its surface tension.

Since the liquid phase occurs in the brazing material 14 after the joint surface of the AlN base plate 11 is vacuumized, the melted brazing material 14 starts to infiltrate after the air in the gas pockets in the porous layer 21 formed on the surface of the AlN base plate 11 is completely removed. Therefore, there is no reduction resistance caused by air, and the brazing material 14 infiltrates in the entire space in the gas pockets of the porous layer 21.

In addition, the brazing material is pushed even into a small space in the gas pocket against the surface tension of the brazing material 14 by being pressurized.

Furthermore, the brazing material 14 is reliably fixed inside the porous layer 21 of the AlN base plate 11 by cooling and setting the melted brazing material 14 after the melted brazing material 14 infiltrates in the gas pockets of the porous layer 21 formed on the surface of the AlN base plate 11.

Figure 8:
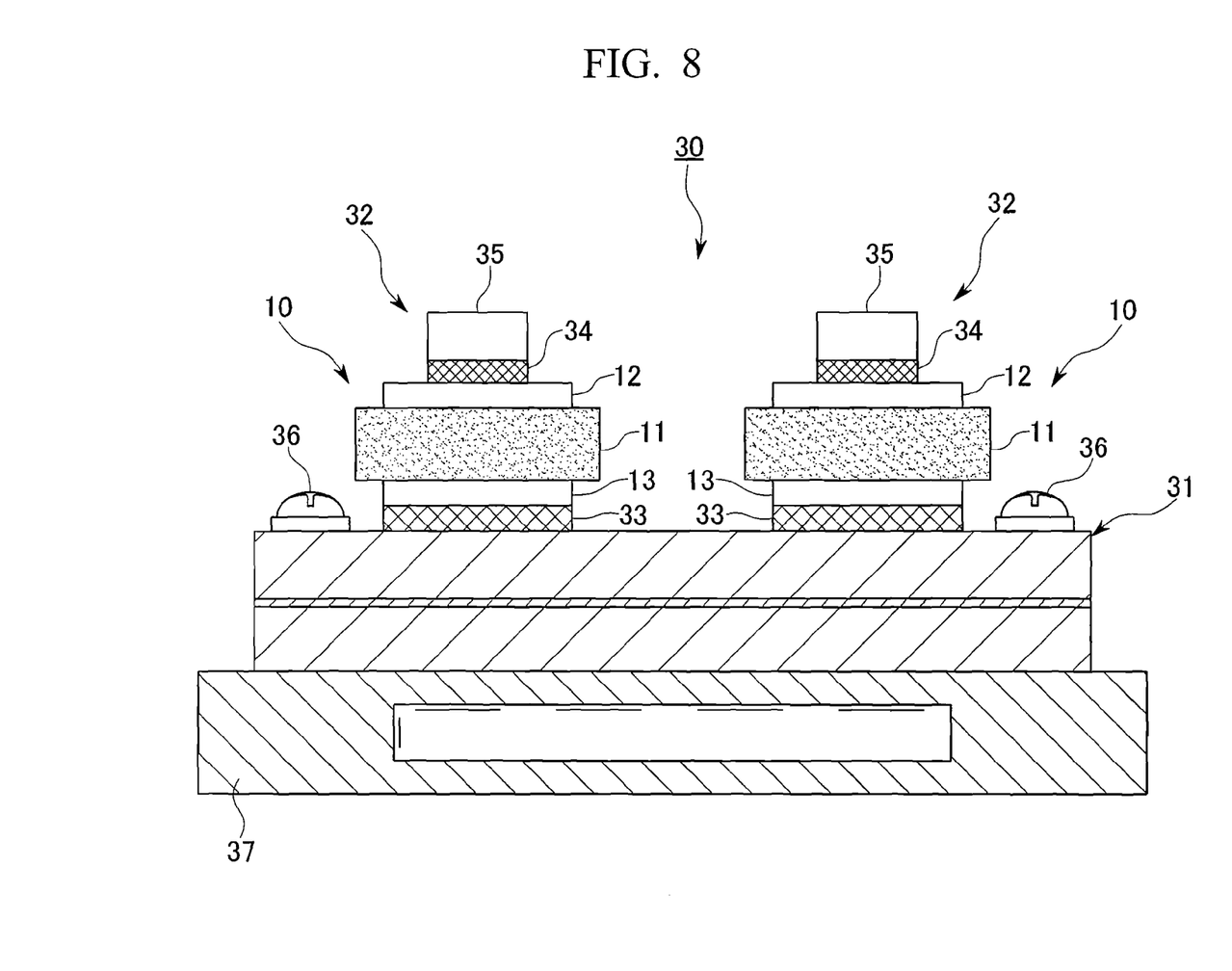
FIG. 8 is a schematic diagram showing a power module base plate and a power module in which an AlN/Al joint material of a third embodiment of the present invention is used.

Next, a power module of a third embodiment of the present invention shall be described. The power module base plate described in the aforementioned second embodiment is mounted on a power module 30 of the present embodiment. FIG. 8 is a diagram showing the power module 30.

As shown in FIG. 8, the power module 30 is constituted by one or more than two rectangular power module base plates 32 being mounted on one of the major faces of a heat-releasing object 31 via a brazing material 33, and by a semiconductor chip 35 being mounted on the upper surface of the power module base plate 32 by a solder 34. The heat-releasing object 31 is a plate member made of Al base alloy. Though the thickness of the heat-releasing object 31 is not limited, for example, one whose thickness is 3 to 10 mm is used.

The power module base plate may be identical to the one of the second embodiment. For example, it includes the AlN base plate of 0.3 to 1.5 mm thickness and the first and the second Al plates 12 and 13 joined to both surfaces of the AlN base plate 11. The thickness of the first and the second Al plates 12 and 13 is, for example, 0.25 to 0.6 mm. The power module base plate 32 is, for example, a rectangular shape whose sides are less than 30 mm.

The power module base plate 32 is brazed on the heat-releasing object 31 by the brazing material. As the brazing material, it is preferable that one or more than two materials be selected from brazing materials of Al—Si series, Al—Cu series, Al—Mg series, Al—Mn series, and Al—Ge series.

When brazing the power module base plate 32 on the heat-releasing object 31, the sheet of the brazing material and the power module base plate 32 are stacked on the heat-releasing object 31 in order, and a load of 50 to 300 kPa is applied on them. The stacked materials are heated at 580 to 650° C. under vacuum or in inactive gas for melting the brazing material and are cooled afterward. The melting point of the brazing material 33 is lower than the melting point of the brazing material 14, and it is preferable that the melting point of the brazing material 33 be within 500 to 630° C., for example, around 575° C. (a melting point is defined as a point beyond liquidus line). In this case, the heat-releasing object 31 and the first Al plate 13 can be joined while the brazing material 14 which joins the AlN base plate 11 and the Al plates 12 and 13 does not melt completely.

In the power module 30 constituted in this manner, male threads 36 are inserted in attachment holes formed on the corner of the heat-releasing object 31. The other side of the heat-releasing object 31 is adhesively fixed to a water-cooled heat sink 37 made of, for example, Al alloy by these respective male threads 36 and female threads formed on the water-cooled heat sink 37 being screwed together.

The power module 30 constituted in this manner has the same advantage as the aforementioned second embodiment.

By mounting the power module base plate 32, the variation in the reduction amount of the power module base plate 32 at its edge in a heat cycle can be controlled to be relatively small, and the heat cycle life of the power module 30 can be extended. As a result, the reliability of the power module can be improved.

SPECIFIC EXAMPLE 1

The power module base plate of the present invention shall be described more specifically by a specific example. First, samples of the AlN ceramic base plate 1 (50 mm×30 mm, 0.635 mm in thickness) indicated by reference symbols A to J were surface-treated under different conditions. The metal circuit plate 2 made of Al with a purity more than 99.9% (100 mm×5 mm width, 0.4 mm in thickness) and the metal plate 3 made of Al with a purity more than 99.9% (50 mm×30 mm width, 0.4 mm in thickness) were laminated and joined on both faces of each sample A to J, with the Al—Si foil (50 mm×5 mm width, 0.1 mm in thickness) being sandwiched therebetween. Joint surfaces were evaluated and joint strengths were measured for the samples manufactured in this manner.

To change the damage amount on their surfaces, honing was performed on each sample A to J, under a different honing number expressed by reference numerals 1 to 3 and different honing pressure expressed by weak, intermediate, and strong. That is, the surface treatment was performed under nine different conditions as will be described below. The surface of the sample J was mechanically grinded by 10 μm.

| Sample: | Honing number: | Pressure |
| --- | --- | --- |
| A: | 1: | weak |
| B: | 1: | intermediate |
| C: | 1: | strong |
| D: | 2: | weak |
| E: | 2: | intermediate |
| F: | 2: | strong |
| G: | 3: | weak |
| H: | 3: | intermediate |
| I: | 3: | strong |
| J: | (mechanically grinded) | |

The joining was performed by applying a load and heating at more than 600° C. under vacuum or in a reduction atmosphere. A portion of the metal circuit plate 2 except the joint portion was bent at 90 degrees, and the bent portion was used as a sample for measuring joint strength (peeling method).

The power module base plates which include the samples manufactured in this manner were evaluated for their initial state and joint condition after a temperature cycle by ultrasonography. The samples for measuring joint strength were also measured for their joint strength (peeling strength) in their initial state and after a temperature cycle (temperature cycle condition: using a device manufactured by Tabai Espec Corp., after 3000 cycles at −40° C.×15 min to 125° C.×15 min (air-filled chamber)). The joint condition was evaluated as: sufficiently preferable in a case in which no peeling occurs (indicated by "good"); slightly insufficient in a case in which peeling less than 1 mm occurs at the end of the joint portion of Al (indicated by "average"); and insufficient in a case in which peeling longer than 1 mm occurs in the region (indicated by "bad").

Three kinds of evaluation were performed on the joint surface. The first evaluation was an observation of a strain occurring region caused by damage due to the surface treatment. As the first evaluation, TEM observation (bright-field) imaging of the ceramic crystal grain on the interface was performed. Damaged crystal grain was defined as a crystal grain having equal to or more than 40% of dark space, which is a dislocated portion, in the crystal grain, and the proportion of the damaged crystal grain is shown by percentage.

The second evaluation was an observation of a strain occurring region. In the second evaluation, the strain of the crystal grain was defined as an inhomogeneous strain analysis value obtained from a crystallite size and a lattice inhomogeneous strain measured by X-ray diffraction, and the damage is expressed as the strain. In the TEM observation, the thickness of the sample was set so that dislocation does not disappear. The results of these experiments are shown in the Table 1 below.

TABLE 1

| Sample | Straining amount evaluation 1 | Straining amount evaluation 2 | Initial joint | Joint strength after temperature cycle | Initial joint strength (N/cm) | Joint strength after temperature cycle (N/cm) | Total evaluation |
| --- | --- | --- | --- | --- | --- | --- | --- |
| A | 0% | 0% | average | bad | ≧150 | ≧150 | bad |
| B | 0% | 0% | good | good | ≧150 | ≧150 | good |
| C | 8% | 0.026% | good | good | ≧150 | ≧150 | good |
| D | 17% | 0.028% | good | good | ≧150 | ≧150 | good |
| E | 29% | 0.029% | good | good | ≧150 | ≧150 | good |
| F | 47% | 0.030% | average | bad | ≧150 | ≧150 | bad |
| G | 53% | 0.032% | average | bad | ≧150 | ≧150 | bad |
| H | 66% | 0.033% | bad | bad | ≧50 | ≧50 | bad |
| I | 81% | 0.035% | bad | bad | ≧50 | ≧50 | bad |
| J | 100% | 0.035% | bad | bad | ≧50 | ≧50 | bad |

In sample A, a large amount of the release agent (BN) remains, namely, 5 as an amount of boron measured by fluorescence X-ray analysis. This seemed to indicate that the honing was insufficient.

As shown in the test result, all of the samples B to E whose straining amount was equal to or less than 29% in the first evaluation, and less than 0.03% in the second evaluation except sample A, in which a large amount of the release agent remained, have a good joint condition in their initial state and after the temperature cycle, and sufficiently high joint strength and reliability was obtained.

The amount of boron is obtained by an expression: a peak height of B—Kα/a peak height of Al—Kα×100000. The peak heights of B—Kα and Al—Kα are obtained by fluorescence X-ray analysis. Peak heights of each element in fluorescence X-ray spectroscopy are measured under the following conditions.

(common conditions)
device: RIX2100
measuring diameter: 20 mm
measuring atmosphere: vacuum
with spin (Boron Peak Height Measuring Conditions)
element: B—Kα
target: Rh
voltage: 20 kV
current: 20 mA
filter: out
attenuator: 1/1
slit: std
crystal: RX70
PHA: 100-330
angle: 49.5° (background 40.0°)
time: 150 sec (background 75 sec)

(Aluminum Peak Height Measuring Conditions)
element: Al—Kα
target: Rh
voltage: 20 kV
current: 20 mA
filter: out
attenuator: 1/1
slit: std
crystal: PET
PHA: 100-300
angle: 144.8°
time: 45 sec The straining amount of crystal grain was measured by the following device under the following condition.
device: RINT2000/PC ULTIMA and sample horizontal goniometer (manufactured by
Rigaku Industrial Corp.)
X-ray used: CuKα
X-ray output: 40 kV, 40 mA, counter monochromator (graphite)
detector: scintillation
measured 2θ range: 64° to 128°
measuring step: 0.01°
accumulated time: 2 seconds/step
slit condition: divergence slit 1°, dispersion slit 1°, receiving slit 0.15 mm The present invention has the following advantage.

According to the power module base plate and the power module of the present invention, since the remaining release agent on the joint surface between the ceramic base plate and the metal plate is less than 5 as an amount of boron measured by fluorescence X-ray analysis, and the crystal grain straining region in the joint surface is equal to or less than 40% or the straining amount of the crystal grain in the joint surface is equal to or less than 0.03%, a high joint strength can be obtained both in its initial state and after the temperature cycle test. Therefore, a power module which is highly reliable under circumstances in which temperature significantly changes can be obtained.

SPECIFIC EXAMPLE 2

The second specific example of the present invention shall be described.

AlN base plates whose materials were honed under different pressures before joining were temperature cycle tested (−45° C. to 125° C.). It was checked whether or not there was peeling by ultrasonography every 1000 cycles, and the greatest temperature cycle number without peeling was determined as the life of the base plate.

The cross section near the AlN/Al interface was observed by a scanning electron microscope (SEM), and the depth of the three-dimensional network structure was measured by element surface analysis of the infiltration depth in the AlN base plate of Si included in the Al component using an electron probe X-ray microanalyzer (EPMA).

The maximum height Ry was measured by a surface roughness measurement (manufactured by Mitsutoyo Corp., Surftest501), and specific surface area was measured by a laser microscope (manufactured by KEYENCE Corp., VK8550). Both the maximum height and the specific surface area were measured at 500-fold magnification.

The depth of the three-dimensional network structure may be measured by surface analysis of the infiltration depth of oxygen element after the surface of Al is oxidized by heating samples, and may also be measured by grinding a sample on which Al is exposed by being grinded from its lower face of the AlN base plate. In this case, the infiltration depth is defined as a thickness of the AlN base plate needed to be grinded for eliminating AlN.

The results of the life test of the specific samples and the comparative examples measured by the peeling between the AlN base plate and Al will be shown below.

TABLE 2

| Sample | Honing pressure (hPa) | Depth of three-dimensional network structure | Ry (μm) | Specific surface area | Temperature cycle causing peeling |
|---|---|---|---|---|---|
| Specific example 1 | 2000 | 0.7 | 1.50 | 2.0 | 3000 |
| Specific example 2 | 1500 | 1.3 | 1.70 | 2.3 | 5000 |
| Specific example 3 | 1000 | 1.9 | 2.30 | 2.6 | 4000 |
| Specific example 4 | 500 | 2.9 | 3.30 | 2.7 | 3000 |
| Comparative example 1 | 3000 | 0.2 | 1.30 | 1.8 | 1000 |
| Comparative example 2 | 2500 | 0.4 | 1.40 | 1.9 | 1000 |
| Comparative example 3 | 300 | 4.0 | 4.00 | 2.9 | 1000 |

In a case in which the honing pressure was 2500 hPa, 3000 hPa, and 300 hPa like comparative examples, the depth of the three-dimensional network structure was 0.2 layers, 0.3 layers, and 4.0 layers, respectively, and the maximum height was 1.30 μm, 1.4 μm, and 4.0 μm, respectively. Since the three-dimensional network structure was formed very shallowly or the maximum height was very large, the specific surface area, which is an index of the surface area and the plane area considering the asperity of the base plate, was less than 2.0 or more than 2.7, and their surface conditions are made unstable.

As a result, peeling was caused by less than 2000 temperature cycles (their life is defined as 1000 cycles).

In the specific examples 1 to 4, the depth of the three-dimensional network structure was maintained within 0.7 to 2.9 layers, the maximum height was maintained within 1.5 to 3.3 μm, and specific surface area was maintained within 2.0 to 2.7. As a result, no peeling occurred in the joint surface after 3000 temperature cycles, while the life of comparative example, which is a conventional product, was 1000 cycles, and it was confirmed that the life is tripled.

The scope of the present invention is not limited to the aforementioned embodiments, and other modifications can be made without departing from the spirit or scope of the present invention.

For example, though the depth of the three-dimensional network structure is approximately 3 layers of the AlN crystal structure in the aforementioned second and third embodiment as shown in FIG. 4, the three-dimensional network structure may be formed within approximately 0.5 to 3 layers.

In addition, though honing is used to form the three-dimensional network structure, it may be formed by a chemical method such as etching.

The aforementioned manufacturing condition is shown as an example, although other manufacturing conditions may be used.

INDUSTRIAL APPLICABILITY

According to the power module base plate and the power module of the present invention, the metal plate and the ceramic base plate can be joined with high strength, and the present invention has an industrial applicability. In addition, according to the manufacturing method of the AlN/Al joint material and the highly reliable AlN/Al joint material manufactured by the manufacturing method, a sufficient life can be obtained while securing a sufficient heat resistance cycle.

The invention claimed is:

1. A base plate for a power module comprising:
   a metal plate;
   a ceramic base plate that is joined to the metal plate and contains X as an element selected from the group consisting of aluminum and silicon; and
   a release agent which includes boron provided in a joint surface between the metal plate and the ceramic base plate, wherein
   a remaining amount of the release agent is less than 5 as an amount of boron measured by fluorescence X-ray analysis,
   a ceramic crystal grain straining region in the joint surface of the ceramic base plate is equal to or less than 40%, and
   the amount of boron is defined as a value obtained by an expression: (a peak height of B-Kα/ a peak height of X-Kα)×100000.

2. The base plate for a power module according to claim 1, wherein the metal plate is made of aluminum, and
   the ceramic base plate is made of any one of aluminum nitride and silicon nitride.

3. A power module comprising:
   the base plate for a power module according to claim 1; and
   a semiconductor chip mounted on the metal plate of the base plate for a power module.

4. A base plate for a power module comprising:
   a metal plate;
   a ceramic base plate that is joined to the metal plate and contains X as an element selected from the group consisting of aluminum and silicon; and
   a release agent which includes boron provided in a joint surface between the metal plate and the ceramic base plate, wherein
   a remaining amount of the release agent is less than 5 as an amount of boron measured by fluorescence X-ray analysis,
   an amount of ceramic crystal grain straining in the joint surface of the ceramic base plate is equal to or less than 0.03%, and
   the amount of boron is defined as a value obtained by an expression: (a peak height of B-Kα/ a peak height of X-Kα) ×100000.

5. The base plate for a power module according to claim 4, wherein the metal plate is made of aluminum, and
   the ceramic base plate is a plate made of any one of aluminum nitride and silicon nitride.

6. A power module comprising:
   the base plate for a power module according to claim 4; and
   a semiconductor chip mounted on the metal plate of the base plate for a power module.

* * * * *